(12) United States Patent
Hung

(10) Patent No.: US 7,508,028 B2
(45) Date of Patent: Mar. 24, 2009

(54) NON-VOLATILE MEMORY

(75) Inventor: Chih-Lung Hung, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 235 days.

(21) Appl. No.: 11/552,993

(22) Filed: Oct. 26, 2006

(65) Prior Publication Data

US 2008/0099818 A1     May 1, 2008

(51) Int. Cl.
*H01L 29/423* (2006.01)
(52) U.S. Cl. .............. 257/318; 257/316; 257/E29.129
(58) Field of Classification Search ........... 257/316, 257/318, E29.129
See application file for complete search history.

(56) References Cited

U.S. PATENT DOCUMENTS

| 4,404,577 | A | * | 9/1983 | Cranford et al. | ........... 257/318 |
| 4,616,245 | A | * | 10/1986 | Topich et al. | ........... 257/318 |
| 5,053,841 | A | * | 10/1991 | Miyakawa et al. | ........... 257/318 |
| 6,424,003 | B2 | * | 7/2002 | Li et al. | ........... 257/318 |
| 6,762,955 | B2 | * | 7/2004 | Sakui et al. | ........... 365/185.05 |

FOREIGN PATENT DOCUMENTS

| JP | 358220464 A | * | 12/1983 | ........... 27/10 |
| JP | 359217369 A | * | 12/1984 | ........... 29/78 |

* cited by examiner

*Primary Examiner*—Victor A Mandala
(74) *Attorney, Agent, or Firm*—Jianq Chyun IP Office

(57) ABSTRACT

A non-volatile memory is provided, including a control gate, a floating gate, a gate oxide layer, a source region, a drain region, a first dielectric layer, a second dielectric layer, and an erase gate. The control gate is disposed in a substrate. The floating gate comprising a coupling part and a gate part is disposed over the control gate and located over a portion of the substrate with the gate oxide layer there-between. The source region adjoins with one side of the gate part, while the drain region adjoins with the other side of the gate part. The first dielectric layer is disposed on the floating gate. The second dielectric layer is disposed on the sidewalls of the floating gate. The erase gate is disposed over the coupling part of the floating gate and covers the first dielectric layer and the second dielectric layer.

6 Claims, 6 Drawing Sheets

NON-VOLATILE MEMORY

BACKGROUND OF THE INVENTION

1. Field of Invention

The present invention relates to a memory device. More particularly, the present invention relates to a non-volatile memory and a manufacturing method and an erasing method thereof.

2. Description of Related Art

Memory, just as its name implies, is a semiconductor device for storing information and data. Memory is required to perform more and more effectively as the functions of microprocessors become stronger and the programs and calculations of software become larger. Memory with mass storage and low cost must be manufactured to meet the requirements of this trend. Therefore, the process of manufacturing such memory devices continuously develops for the semiconductor technology with higher integration.

Among memories, non-volatile memory is capable of storing, reading, or erasing data repeatedly, and the stored data will not disappear after the power supply is disconnected. Because of these advantages, non-volatile memory has become a memory device widely employed in personal computers and electronic apparatuses.

FIG. 1 is a schematic cross-sectional view of a conventional single poly non-volatile memory. The conventional single poly non-volatile memory consists of an N-type metal oxide semiconductor (NMOS) structure 10 and a P-type metal oxide semiconductor (PMOS) structure 12, and a field oxide layer 11 between the NMOS structure 10 and the PMOS 12 structure. The NMOS structure 10 is formed on a P-type substrate 14, and comprises a floating gate 16, a gate oxide layer 34, an $N^+$ source doped region 18, and an $N^+$ drain doped region 20. The PMOS structure 12 is formed on an N-type ion well region 22, and comprises a floating gate 24, a gate oxide layer 36, a $P^+$ source doped region 26, and a $P^+$ drain doped region 28. Additionally, an N-type channel barrier region 30 is disposed below the floating gate 24 and adjoins to one side of the $P^+$ source doped region 26. Furthermore, a floating gate wire 32 should be disposed between the floating gates 16 and 24, in order to maintain the same potential for the floating gates 16 and 24.

However, the conventional single poly non-volatile memory encounters a few problems. For example, the conventional single poly non-volatile memory including the NMOS structure 10 and the PMOS structure 12 occupies a much larger chip area, which results in a relatively high production cost. On the other hand, the conventional single poly non-volatile memory takes a longer time to erase data, resulting in low operating speed of the memory device. Moreover, for the erasing operation of the conventional single poly non-volatile memory, the electrons are drawn from the floating gate to the substrate through the gate oxide layer, and the gate oxide layer may be easily damaged, thus adversely affecting the cycling number and the reliability of the memory device.

FIG. 2 is a schematic cross-sectional view of a split gate non-volatile memory. The conventional split gate non-volatile memory comprises a substrate 40, a floating gate 42, a control gate 44, a source region 46, and a drain region 48. However, the memory device employing the conventional split gate non-volatile memory has a larger size, and electron can be trapped easily for the erasing operation, thus lowering endurance of the memory device.

SUMMARY OF THE INVENTION

Accordingly, the present invention is directed to provide a non-volatile memory and a manufacturing method and an erasing method thereof, which are capable of reducing the erasing time, accelerating the operating speed of the device, and increasing the cycling numbers.

The invention provides a non-volatile memory, which comprises a control gate, a floating gate, a gate oxide layer, a source region, a drain region, a first dielectric layer, a second dielectric layer, and an erase gate. The control gate is disposed in the substrate, and the floating gate is disposed over the control gate and located on the substrate. The floating gate comprises a coupling part and a gate part. The gate oxide layer is disposed between the floating gate and the substrate. The source region is disposed in the substrate and adjoins with one side of the gate part of the floating gate. The drain region is disposed in the substrate and adjoins with the other side of the gate part of the floating gate. The first dielectric layer is disposed on the floating gate. The second dielectric layer is disposed on sidewalls of the floating gate. Additionally, the erase gate is disposed over the coupling part of the floating gate and covers the first dielectric layer and the second dielectric layer.

According to one embodiment of the invention, the top edge of the floating gate is sharp-angled.

According to the embodiment of the invention, the control gate is, for example, a heavily doped region.

According to the embodiment of the invention, the material of the erase gate is, for example, polysilicon or doped polysilicon.

According to the embodiment of the invention, the material of the floating gate is, for example, polysilicon or doped polysilicon.

According to the embodiment of the invention, the material of the gate oxide layer is, for example, silicon oxide.

The invention further provides an erasing method of a non-volatile memory, wherein the non-volatile memory comprises a control gate disposed in a substrate; a floating gate comprising a coupling part and a gate part disposed on the control gate and located on a portion of the substrate; a gate oxide layer disposed between the floating gate and the substrate; a source region disposed in the substrate and neighboring to one side of the gate part of the floating gate; a drain region disposed in the substrate and neighboring to the other side of the gate part of the floating gate; a first dielectric layer disposed on the floating gate; a second dielectric layer disposed on sidewalls of the floating gate; and an erase gate disposed over the coupling part of the floating gate and covering the second dielectric layer. The erasing method comprises applying a first voltage on the control gate, applying a second voltage on the drain, applying a third voltage on the source, applying a fourth voltage on the erase gate, and applying a fifth voltage on the substrate, such that electrons are drawn from the floating gate to the erase gate to be erased.

According to one embodiment of the invention, the first voltage, the second voltage, the third voltage, and the fifth voltage are zero volts, and the fourth voltage is 12 volts.

The invention further provides a manufacturing method of a non-volatile memory, which comprises first providing a substrate that has at least a device isolation structure for defining multiple pairs of active regions; forming a control gate in one of each pair of the active regions of the substrate; forming a gate oxide layer, a conductor layer, and a patterned mask layer on the substrate in sequence, wherein the patterned mask layer exposes a portion of the conductor layer; forming a first dielectric layer on the surface of the exposed portion of the conductor layer; removing the patterned mask layer; removing the conductor layer without covering the first dielectric layer, and using the remained conductor layer as the floating gate; forming a second dielectric layer on sidewalls of the floating gate; forming an erase gate above the floating gate and correspondingly above the control gate, wherein the erase gate covers the first dielectric layer and the second dielectric layer; and forming a source region and a drain region in the other one of each pair of the active regions of the substrate, and the source region and the drain region being respectively disposed at both sides of the floating gate.

According to one embodiment of the invention, the top edge of the floating gate is sharp-angled. The material of the floating gate is, for example, polysilicon or doped polysilicon, and the method for forming the same is, for example, chemical vapor deposition.

According to the embodiment of the invention, the control gate is, for example, a heavily doped region, and the method for forming the same is, for example, ion-implantation.

According to the embodiment of the invention, the material of the erase gate is, for example, polysilicon or doped polysilicon, and the method for forming the same is, for example, chemical vapor deposition.

According to the embodiment of the invention, the material of the gate oxide layer is, for example, silicon oxide, and the method for forming the same is, for example, thermal oxidation.

According to the embodiment of the invention, the device isolation structure is, for example, a field oxide layer and the method of forming the same is, for example, local oxidation of silicon.

In the non-volatile memory of the invention, since the heavily doped region formed in the substrate is used as the control gate, and an erase gate is formed above the floating gate, the chip size is not increased. Hence, the manufacturing cost will not be increased and the integration of the device will not be compromised. Additionally, in the erasing operation of the non-volatile memory of this invention, because a high voltage is applied on the erase gate for drawing the electrons to the erase gate to be erased, the non-volatile memory of this invention will not suffer the problem of damages in the gate oxide layer as the conventional single poly non-volatile memory, and the cycling number and the reliability of the memory device can be improved. Furthermore, the non-volatile memory of this invention affords shorter operating time for the erasing operation. In addition, because the top edge of the floating gate is sharp-angled, the erasing speed is further accelerated during the erasing operation.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 3A-3H are top views of the steps of the manufacturing method of the non-volatile memory according to one embodiment of the invention.

Figure 1:
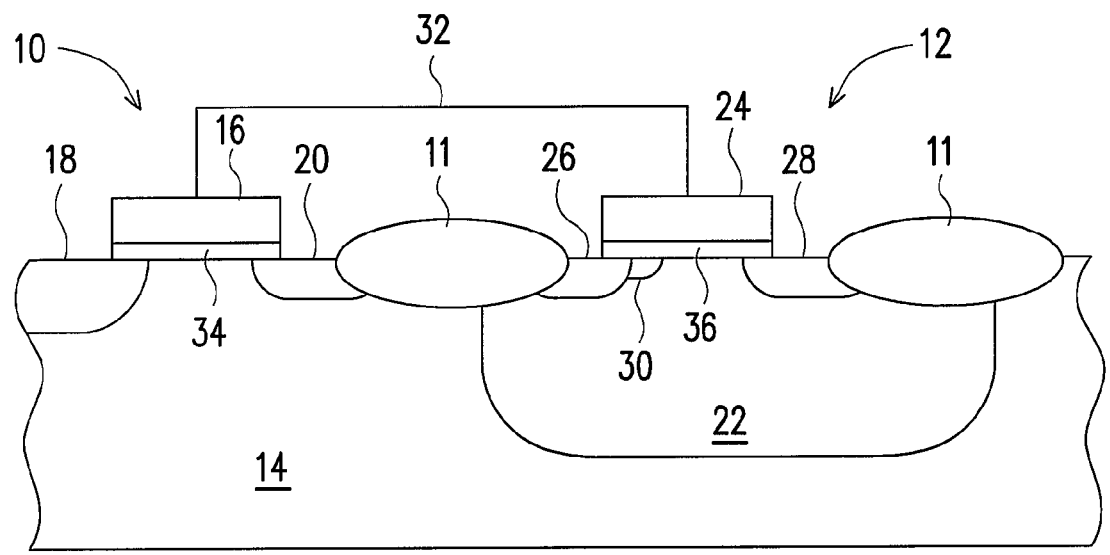
FIG. 1 is a schematic cross-sectional view of a conventional single poly non-volatile memory.
Figure 2:
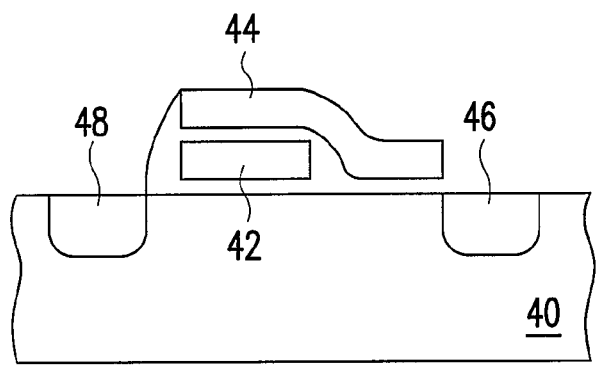
FIG. 2 is a schematic cross-sectional view of a split gate non-volatile memory.
Figure 3A:
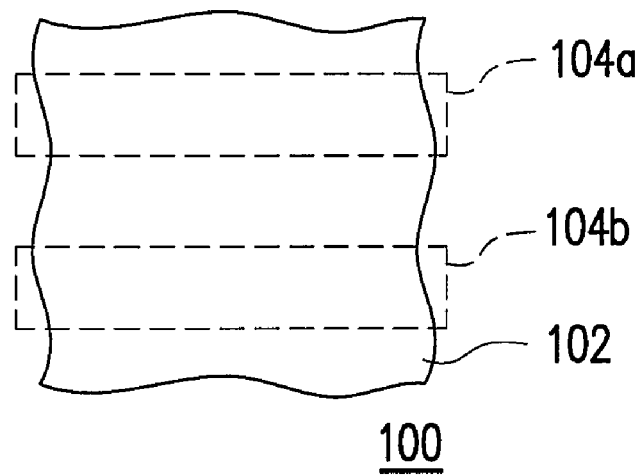
FIGS. 3A-3H are top views of the steps of the manufacturing method of the non-volatile memory according to one embodiment of the invention.

Firstly, with reference to FIG. 3A, a device isolation structure 102 is formed in a substrate 100 for defining a pair of active regions 104a and 104b. The device isolation structure 102 is, for example, a field oxide layer, and the method for forming the same is, for example, local oxidation of silicon (LOCOS).

Figure 3B:
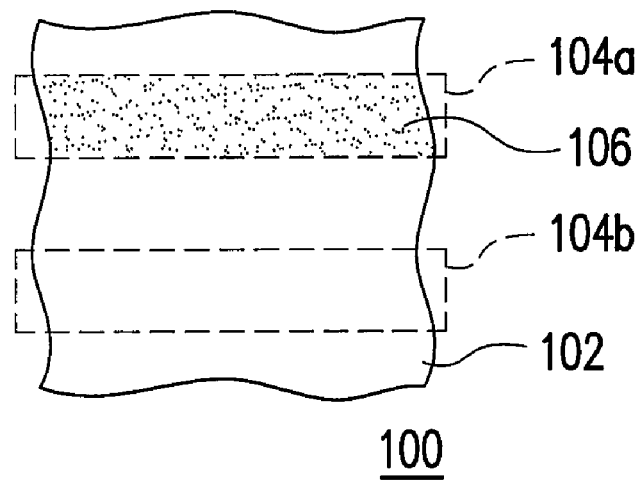

Then, with reference to FIG. 3B, a control gate 106 is formed in one of the active regions 104a and 104b of the substrate 100. In the embodiment, forming the control gate 106 in the active region 104a of the substrate 100 is taken as an example. The control gate 106 is, for example, a heavily doped region formed in the substrate 100, formed by ion-implantation.

Figure 3C:
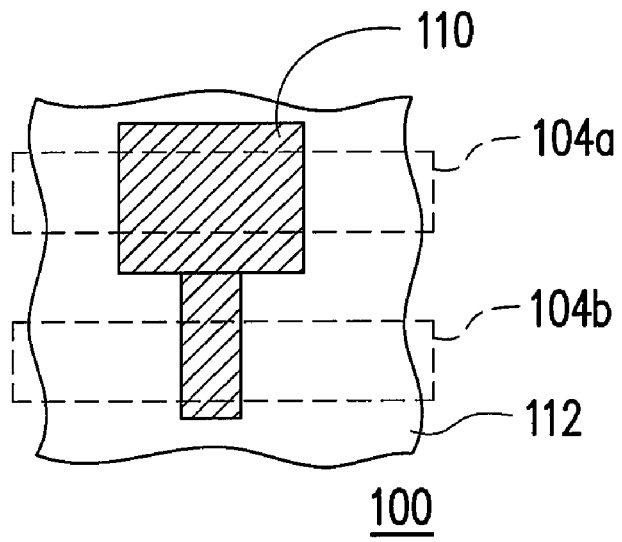

Subsequently, with reference to FIG. 3C, a gate oxide layer 108, a conductor layer 110, and a patterned mask layer 112 are formed on the substrate 100 in sequence, and the patterned mask layer 112 exposes a portion of the conductor layer 110. The material of the gate oxide layer 108 is, for example, silicon oxide, formed by thermal oxidation. The material of the conductor layer 110 is, for example, polysilicon or doped polysilicon, and the method for forming the same is, for example, chemical vapor deposition. Additionally, the material of the patterned mask layer 112 is, for example, silicon nitride or other suitable materials, and the method for forming the same is a chemical vapor deposition process.

Figure 3D:
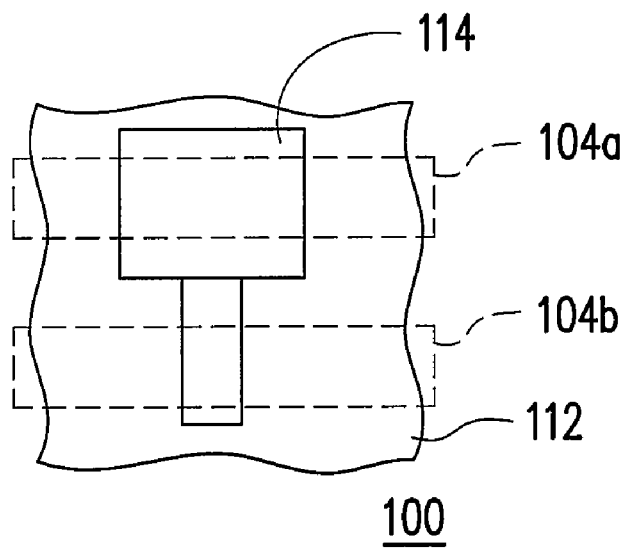

Next, with reference to FIG. 3D, a dielectric layer 114 is formed on the surface of the exposed conductor layer 110. The material of the dielectric layer 114 is, for example, silicon oxide formed by chemical vapor deposition. Alternatively, the dielectric layer 114 may be formed by thermal oxidation, and then the top edge of the conductor layer 110 is sharp-angled due to the high temperature of the thermal process.

Figure 3E:
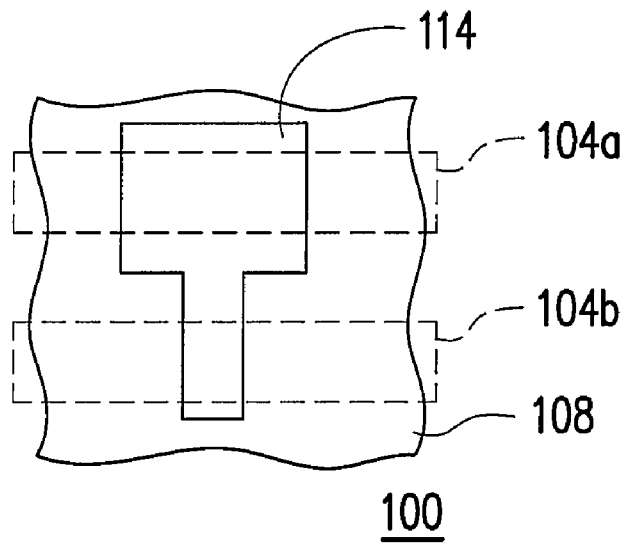

Then, with reference to FIG. 3E, the patterned mask layer 112 is removed, and the conductor layer 110 not covered by the dielectric layer 114 is removed. Then, the remained conductor layer is used as a floating gate 111. The method for removing the patterned mask layer 112 is, for example, an etching process. Additionally, the method for removing the conductor layer 110 is, for example, an etching process.

Figure 3F:
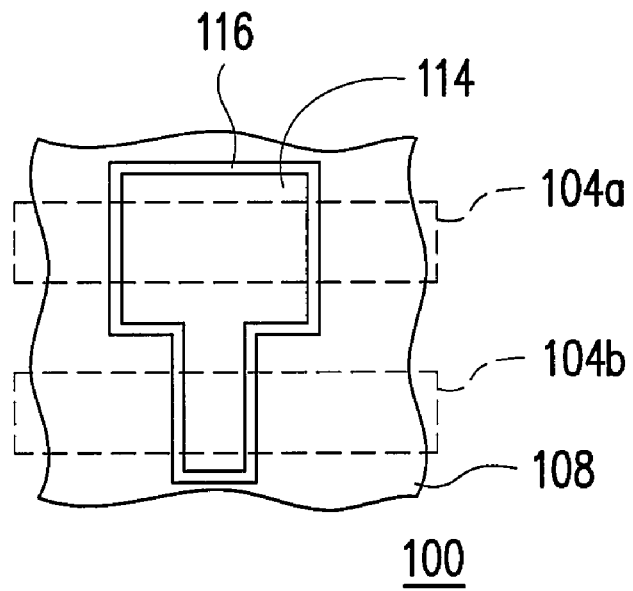

Then, with reference to FIG. 3F, a dielectric layer 116 is formed on the sidewalls of the floating gate 111. The dielectric layer 116 is, for example, a nitrided oxide (NO) layer, and the method for forming the same is, for example, chemical vapor deposition.

Figure 3G:
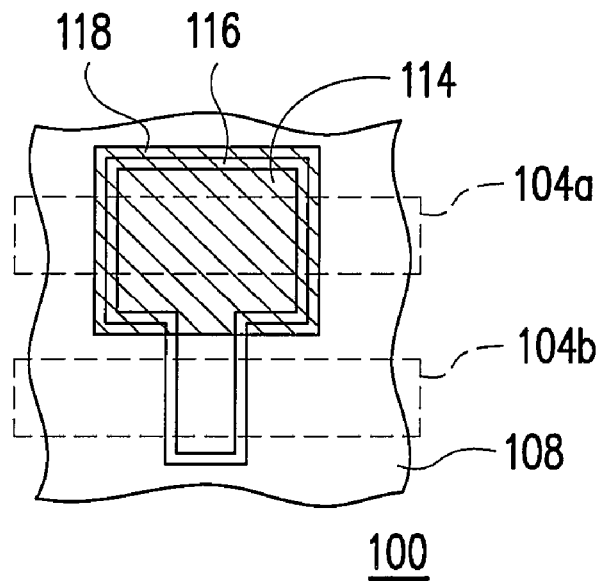

Subsequently, with reference to FIG. 3G, an erase gate 118 is formed above the floating gate 111 and corresponding above the control gate 106, wherein the erase gate 118 covers the dielectric layers 114 and 116. The material of the erase gate 118 is, for example, polysilicon or doped polysilicon, and the method for the same is, for example, chemical vapor deposition.

Figure 3H:
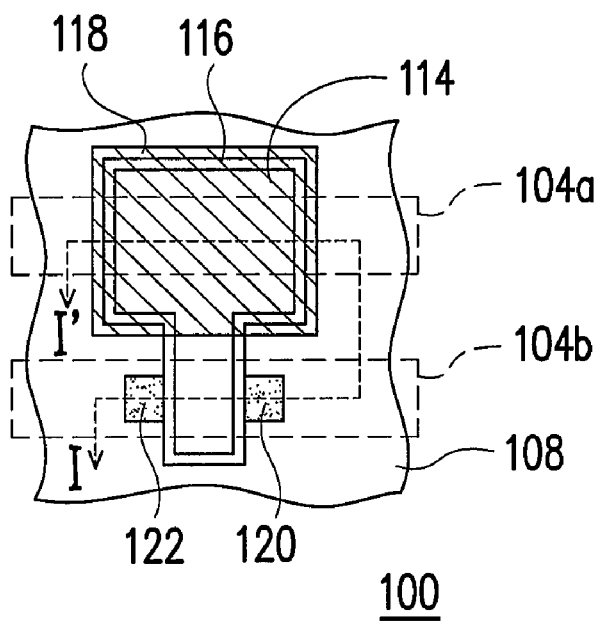

Then, with reference to FIG. 3H, a source region 120 and a drain region 122 are formed in the active region 104b of the substrate 100, wherein the source region 120 and a drain region 122 are formed at both sides of the floating gate 111 respectively. The method for forming the source region 120 and the drain region 122 is, for example, ion-implantation.

Finally, after the manufacturing process of the non-volatile memory is completed, the subsequent inter layer dielectric (ILD), contact, conductor layer, and the like may be further fabricated. The process and related process parameters can be achieved by those skilled in the art and will not be described any more.

In view of the above, the manufacturing method of the non-volatile memory of the invention is compatible with the common semiconductor manufacturing process. That is, the manufacturing method of the non-volatile memory of the invention can be integrated in the common semiconductor manufacturing process without extra process steps. As such, the manufacturing costs and time are saved.

Figure 4:
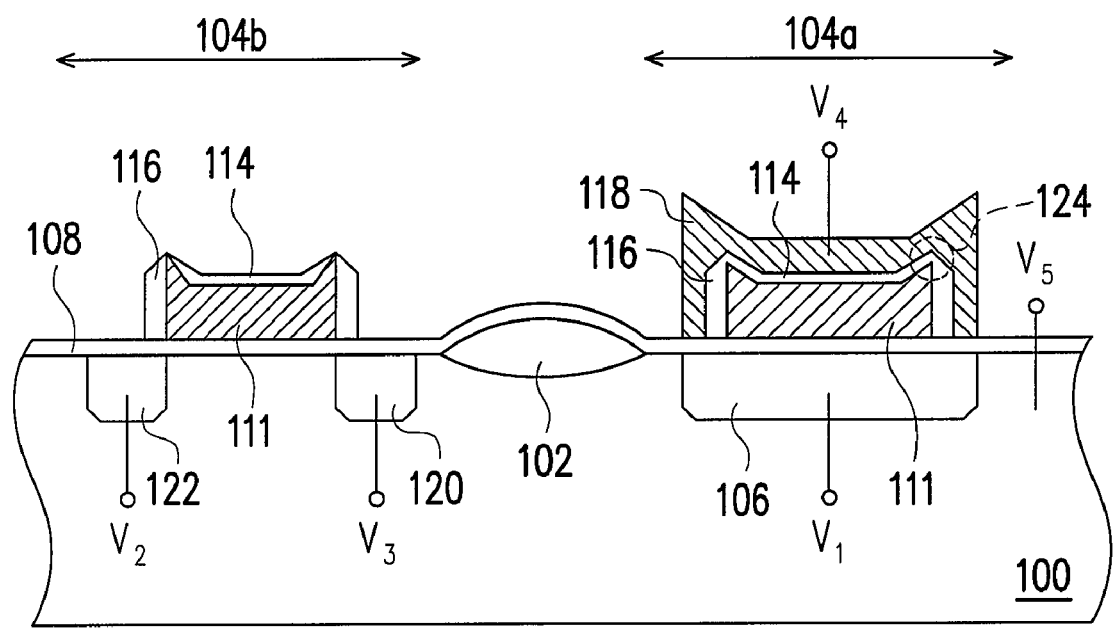
FIG. 4 is a schematic cross-sectional view of the non-volatile memory according to one embodiment of the invention.

Next, the structure of the non-volatile memory according to this invention will be illustrated in FIG. 4. FIG. 4 is a schematic cross-sectional view of the non-volatile memory taken along line I-I' in FIG. 3H.

With reference to FIGS. 3H and 4, the non-volatile memory of the invention comprises the control gate 106, the floating gate 111, the gate oxide layer 108, the source region 120, the drain region 122, the dielectric layer 114, the dielectric layer 116, and the erase gate 118.

The control gate 106 is disposed in the substrate 100, and the control gate 106 is, for example, a heavily doped region. Additionally, the floating gate 111 is disposed over the control gate 106 and located on a portion of the substrate 110. The floating gate 111 comprises a coupling part and a gate part, wherein the coupling part of the floating gate 111 refers to the floating gate 111 located in the active region 104a, the gate part of the floating gate 111 refers to the floating gate 111 located in the active region 104b. The material of the floating gate 111 is, for example, polysilicon or doped polysilicon. In one embodiment, the top edge of the floating gate 111 is sharp-angled as shown by an arrow 124 in FIG. 4.

Additionally, the gate oxide layer 108 is disposed between the floating gate 111 and the substrate 100, and the material is, for example, silicon oxide. The gate oxide layer 108 is used to isolate the floating gate 111 from the control gate 106, as well as the floating gate 111 from the substrate 100. The source region 120 is disposed in the substrate 100 and adjoins with one side of the gate part of the floating gate 111. The drain region 122 is disposed in the substrate 100 and adjoins with the other side of the gate part of the floating gate 111. The erase gate 118 is disposed over the coupling part of the floating gate 111 and covers the dielectric layers 114 and 116, wherein the material of the erase gate 118 is, for example, polysilicon or doped polysilicon. The dielectric layer 114 is disposed on the floating gate 111 and the dielectric layer 116 is disposed on the sidewalls of the floating gate 111, and the dielectric layers 114 and 116 are used to isolate the floating gate 111 from the erase gate 118.

On the other hand, in the non-volatile memory of the invention, since a heavily doped region formed in the substrate is used as the control gate, and an erase gate is formed over the floating gate, the chip size is not increased, thereby not increasing the manufacturing cost.

Referring to FIG. 4 for further understanding the erasing operation mode of the non-volatile memory of the embodiment of the invention.

When an erasing operation is performed for the non-volatile memory, a voltage $V_1$ is applied on the control gate 106, a voltage $V_2$ is applied on the drain 122, a voltage $V_3$ is applied on the source 120, a voltage $V_4$ is applied on the erase gate 118, and a voltage $V_5$ is applied on the substrate 100. Thus, the electrons are drawn from the floating gate 111 to the erase gate 118 to be erased. The voltages $V_1$, $V_2$, $V_3$, and $V_5$ are zero volts and the voltage $V_4$ is 12 volts. In other words, the erasing operation of the non-volatile memory of the invention is performed by applying a high voltage on the erase gate.

Furthermore, the operation for programming the non-volatile memory comprises, for example, applying a voltage $V_1$ on the control gate 106, applying a voltage $V_2$ on the drain 122, applying a voltage $V_3$ on the source 120, applying a voltage $V_4$ on the erase gate 118, and applying a voltage $V_5$ on the substrate 100. Thus, the electrons bump and jump from the drain 122 to the floating gate 111 to be stored with the hot carrier, wherein the voltage $V_1$ is of 12 volts, the voltage $V_2$ is 8 volts, the voltages $V_3$ and $V_5$ are zero volts, and the voltage $V_4$ is floating.

Additionally, the method for reading the non-volatile memory comprises, for example, applying a voltage $V_1$ on the control 106, applying a voltage $V_2$ on the drain 122, applying a voltage $V_3$ on the source 120, applying a voltage $V_4$ on the erase gate 118, and applying a voltage $V_5$ on the substrate 100. The voltage $V_1$ is of 2.5 volts, the voltage $V_2$ is of 2.5 volt, the voltages $V_3$ and $V_5$ are of zero volts, and the voltage $V_4$ is floating.

It should be noted that for the erasing operation of the non-volatile memory, the electrons are drawn to the erase gate to be erased without passing through the gate oxide layer. Therefore, the gate oxide layer of the non-volatile memory of this invention will not suffer damages as in the case of the conventional single poly non-volatile memory, thus the cycling number and the reliability of the memory device will not be influenced. Moreover, the operating time for the erasing operation of the non-volatile memory of this invention is shorter and has a more rapid operating speed.

In particular, the top edge of the floating gate of the non-volatile memory of the invention is sharp-angled. Therefore, when the erasing operation is performed, the electrons can be drawn to the erase gate through the top edge of the floating gate, and the erasing speed can be further accelerated.

In view of the above, the invention at least has the following advantages.

1. The erasing operation of the non-volatile memory of the invention affords a shorter operating time and has a more rapid operating speed.

2. The erasing operation of the non-volatile memory of the invention will not cause damage to the gate oxide layer, thereby increasing the cycling numbers and improving the reliability of the device.

3. The structure of the non-volatile memory of the invention increase the chip size, so that the manufacturing cost will not be increased and the integration of the device will not be influenced either.

4. The manufacturing method of the non-volatile memory of the invention can be integrated in the common semiconductor manufacturing process without any extra process step, thereby saving the manufacturing costs and time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
   a control gate disposed in a substrate;

a floating gate disposed over the control gate and located over a portion of the substrate, and comprising a coupling part and a gate part;

a gate oxide layer disposed between the floating gate and the substrate;

a source region disposed in the substrate and neighboring to one side of the gate part of the floating gate;

a drain region disposed in the substrate and neighboring to the other side of the gate of the floating gate;

a first dielectric layer disposed on the floating gate;

a second dielectric layer disposed on sidewalls of the floating gate; and an erase gate disposed over the coupling part of the floating gate and covering the first dielectric layer and the second dielectric layer.

2. The non-volatile memory as claimed in claim 1, wherein a top edge of the floating gate is sharp-angled.

3. The non-volatile memory as claimed in claim 1, wherein the control gate comprises a heavily doped region.

4. The non-volatile memory as claimed in claim 1, wherein a material of the erase gate comprises polysilicon or doped polysilicon.

5. The non-volatile memory as claimed in claim 1, wherein a material of the floating gate comprises polysilicon or doped polysilicon.

6. The non-volatile memory as claimed in claim 1, a material of the gate oxide layer comprises silicon oxide.

* * * * *